(12) United States Patent
Yoon et al.

(10) Patent No.: US 8,232,619 B2
(45) Date of Patent: Jul. 31, 2012

(54) SEMICONDUCTOR IC HAVING ELECTRICAL FUSE CAPABLE OF PREVENTING THERMAL DIFFUSION

(75) Inventors: Young Hee Yoon, Ichon-shi (KR); Jun Gi Choi, Ichon-shi (KR); Sang Hoon Shin, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 198 days.

(21) Appl. No.: 12/836,482

(22) Filed: Jul. 14, 2010

(65) Prior Publication Data

US 2011/0186961 A1    Aug. 4, 2011

(30) Foreign Application Priority Data

Jan. 29, 2010    (KR) .................. 10-2010-0008693

(51) Int. Cl.
*H01L 23/52* (2006.01)
*H01L 23/34* (2006.01)

(52) U.S. Cl. . 257/529; 257/712; 257/713; 257/E23.149; 257/E21.592

(58) Field of Classification Search .................. 257/529, 257/530, 712, 713, E23.149, E21.592
See application file for complete search history.

(56) References Cited

U.S. PATENT DOCUMENTS

| | | | |
|---|---|---|---|
| 6,121,074 A | 9/2000 | Prein | |
| 6,541,290 B1 | 4/2003 | Bang et al. | |
| 6,682,959 B2 | 1/2004 | Kim et al. | |
| 6,803,301 B2 | 10/2004 | Zimmerman et al. | |
| 2008/0186788 A1* | 8/2008 | Barth | 365/225.7 |
| 2011/0140235 A1* | 6/2011 | Oda | 257/529 |
| 2011/0248379 A1* | 10/2011 | Yonezu et al. | 257/529 |
| 2011/0272692 A1* | 11/2011 | Han et al. | 257/48 |

FOREIGN PATENT DOCUMENTS

| | | |
|---|---|---|
| JP | 2002-270692 | 9/2002 |
| KR | 1020040050663 A | 6/2004 |

* cited by examiner

*Primary Examiner* — Ngan Ngo
(74) *Attorney, Agent, or Firm* — William Park & Associates Ltd.

(57) ABSTRACT

Provided is a semiconductor integrated circuit. The semiconductor integrated circuit comprises: a pair of interconnections; a fuse connecting the pair of interconnections; and one or more heat dissipation patterns connecting the pair of interconnections and are disposed around the fuse.

17 Claims, 4 Drawing Sheets

SEMICONDUCTOR IC HAVING ELECTRICAL FUSE CAPABLE OF PREVENTING THERMAL DIFFUSION

CROSS-REFERENCE TO RELATED APPLICATION

The present application claims priority under 35 U.S.C. §119(a) to Korean Patent Application No. 10-2010-0008693, filed on Jan. 29, 2010, in the Korean Intellectual Property Office, which is incorporated herein by reference in its entirety as if set forth in full.

BACKGROUND

1. Technical Field

Various embodiments of the present disclosure generally relate to a semiconductor integrated circuit (IC), and more particularly, to an electrical fuse structure of a semiconductor IC.

2. Related Art

Semiconductor ICs comprise a fuse to repair an error cell, store a chip identification (ID), and provide a variety of mode signals.

Such a fuse may be a laser blowing type or an electrical blowing type.

A fuse blown by laser beams may have an effect upon an adjacent fuse line when the laser beams are irradiated. Therefore, the fuse needs to be spaced a predetermined distance or more from the fuse line. This may degrade layout efficiency in a high-integrated semiconductor circuit.

When a programming current is applied to a fuse link in the electrical blowing type fuse, the fuse link blows due to an electromigration (EM) effect and Joule heating. Such an electrical blowing type fuse may be utilized even after a package level, and is referred to as an electrical fuse.

FIG. 1 is a schematic perspective view showing a state in which a conventional electrical fuse is ruptured. Referring to FIG. 1, an electrical fuse F connects upper and lower conductive layers M1 and M2, and is ruptured by a programming current flowing between the upper and lower conductive layers M1 and M2.

When the electrical fuse F is ruptured, the temperature of the ruptured portion of the electrical fuse F may rise up to several thousand degrees. When such high temperature is reached, a large amount of high-temperature heat 10 radiates externally.

The radiating high-temperature heat is transferred to adjacent elements to change the properties of semiconductor devices formed at positions adjacent to the fuse.

SUMMARY OF THE INVENTION

In one aspect of the present invention, a semiconductor integrated circuit comprises: a pair of interconnections; a fuse connecting the pair of interconnections; and one or more heat dissipation patterns connecting the pair of interconnections and are disposed around the fuse.

In another aspect of the present invention, a semiconductor integrated circuit comprises: a first lower interconnection having a predetermined area; a second lower interconnection positioned on substantially the same plane as the first lower interconnection and spaced a predetermined distance from the first lower interconnection; a first upper interconnection configured to overlap with the first lower interconnection; a second upper interconnection positioned on substantially the same plane as the first upper interconnection, spaced a predetermined distance from the first upper interconnection, and configured to overlap with the second lower interconnection; a fuse connected to the first lower interconnection and the second upper interconnection; a first group of heat dissipation paths connecting the first lower interconnection and the first upper interconnection and disposed around the fuse; and a second group of heat dissipation paths connecting the second lower interconnection and the second upper interconnection and are disposed around the fuse.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
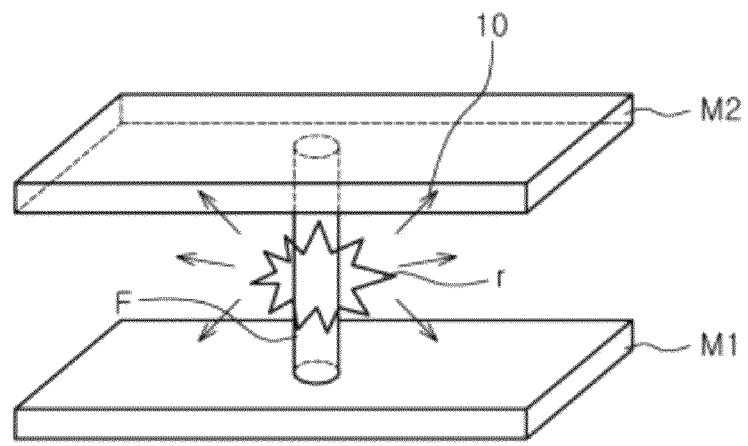
FIG. 1 is a schematic perspective view showing a state in which a conventional electrical fuse is ruptured.

Advantages and characteristics of the present invention and a method for achieving them will be apparent with reference to embodiments described below in addition with reference to the accompanying drawings. However, the present invention is not limited to the exemplary embodiments described below but may be implemented in various forms. Therefore, the exemplary embodiments are provided to enable those skilled in the art to thoroughly understand the teaching of the present invention and to completely inform the scope of the present invention and the exemplary embodiment is just defined by the scope of the appended claims. Throughout the specification, like elements refer to like reference numerals.

Figure 2:
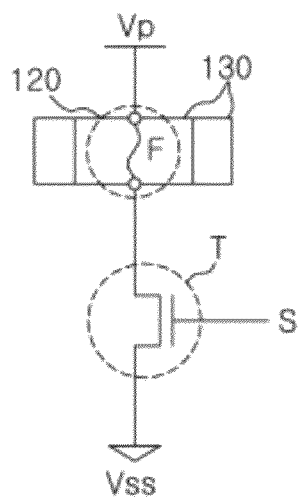
FIG. 2 is an equivalent circuit diagram of an electrical fuse structure, according to one embodiment of the invention.

FIG. 2 is a fuse structure 100, according to one embodiment of the invention. The fuse structure 100 according to the embodiment comprises an electrical fuse 120 that connects a program voltage source Vp and a drive transistor T.

A plurality of heat dissipation paths 130 surrounds the electrical fuse 120. Each of the heat dissipation paths 130 may also connect the program voltage source Vp and the drive transistor T.

The drive transistor T connects the electrical fuse 120 and a ground terminal VSS, and is driven by a repair signal S.

When the repair signal S is activated, the drive transistor T is turned on and applies a large amount of current to the electrical fuse 120. The electrical fuse 120 is then ruptured by the heat caused by the current.

Afterwards, the plurality of heat dissipation paths 130 surrounding the electrical fuse 120 relieve the heat generated from the rupturing of the electrical fuse 120, and then externally discharge the residual heat with a lowered temperature.

Figure 3:
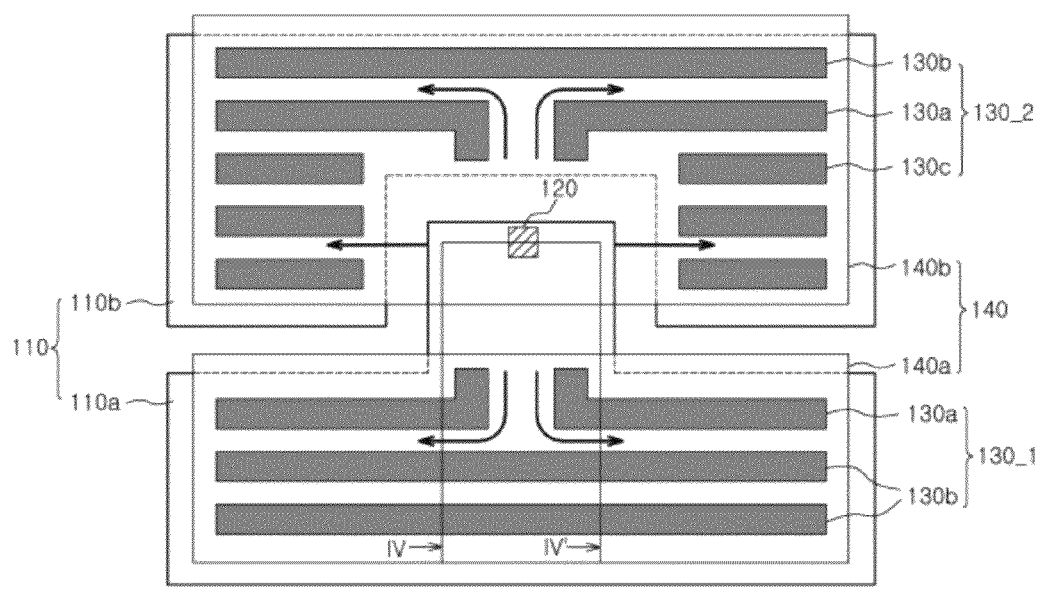
FIG. 3 is a plan view of the electrical fuse structure, according to one embodiment of the invention.

FIG. 3 is a detailed diagram of the electrical fuse structure 100.

Referring to FIG. 3, the electrical fuse 120 may be electrically connected to a lower interconnection 110, which is connected to the drive transistor T, and an upper interconnection 140, which is connected to the program voltage source VP. Also, FIG. 4 shows a perspective view of the electrical fuse structure taken along the line IV-IV' of FIG. 3.

Figure 4:
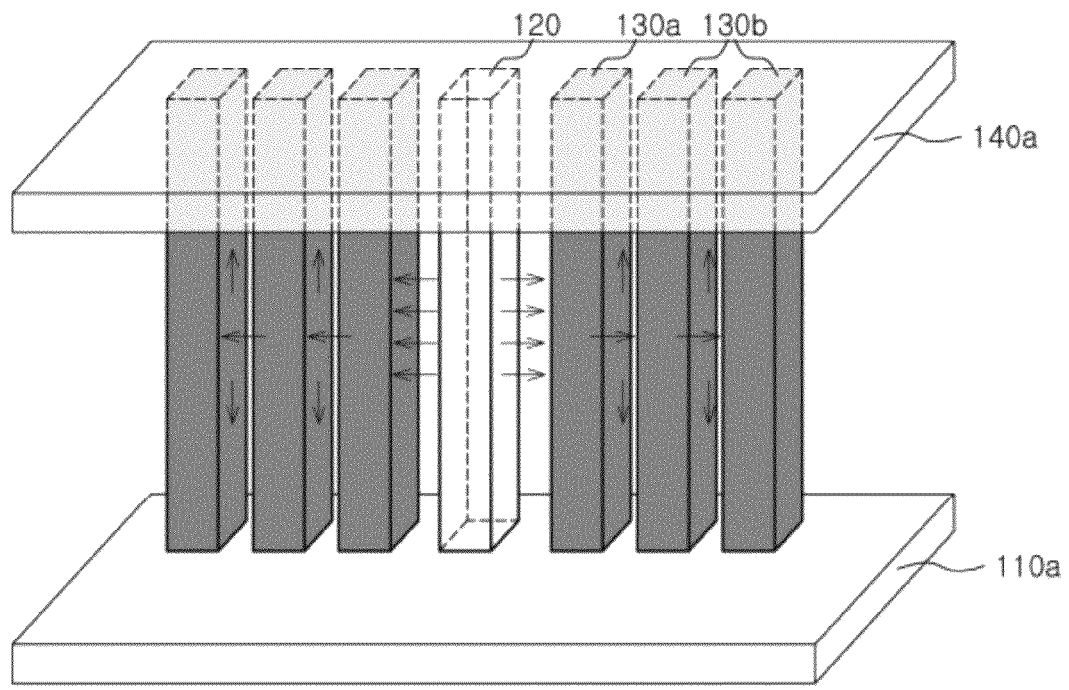
FIG. 4 is a perspective view of the electrical fuse structure taken along the line IV-IV' of FIG. 3.

According to the embodiment, with reference to FIGS. 3 and 4, the lower interconnection 110 may be divided into a first lower interconnection 110a and a second lower interconnection 110b, which are positioned on substantially the same plane. The first and second lower interconnections 110a and 110b are spaced a predetermined distance from each other. Furthermore, the first and second lower interconnections 110a and 110b have substantially rectangular shapes. The first lower interconnection 110a may comprise a protruding portion, and the second lower interconnection 110b may comprise a concave portion that accomodates the protruding portion.

The upper interconnection 140 faces the lower interconnection 110, separated by a predetermined distance. An insulating layer may be interposed between the upper and lower interconnections 140 and 110. The upper interconnection 140 may be divided into a first upper interconnection 140a and a second upper interconnection 140b, which are positioned on substantially the same plane. The first and second upper interconnections 140a and 140b may overlap the first and second lower interconnections 110a and 110b, respectively. In particular, the second upper interconnection 140b overlaps the protruding portion of the first lower interconnection 110a. Furthermore, the first and second upper interconnections 140a and 140b are also spaced by a predetermined distance.

The space between the upper and lower interconnections may serve as a heat release path, and may selectively increase the current density of the lower interconnection. This will be described below in detail.

The electrical fuse 120 is electrically connected to the protruding portion of the first lower interconnection 110a and the second upper interconnection 140b. The electrical fuse 120 may be formed in a contact plug shape, for example.

Meanwhile, a plurality of heat dissipation paths 130 are provided around the electrical fuse 120 between the lower and upper interconnections 110 and 140.

The plurality of heat dissipation paths 130 may be divided into a first group of heat dissipation paths 130_1 that connects the first lower interconnection 110a and the first upper interconnection 140a and a second group of heat dissipation paths 130_2 that connects the second upper interconnection 110b and the second upper interconnection 140b.

The first group of heat dissipation paths 130_1 comprise a plurality of heat dissipation patterns which electrically connect the first upper and lower interconnections 110a and 140a. The plurality of heat dissipation patterns composing the first heat dissipation group 130_1 may be divided into main heat dissipation patterns 130a and sub heat dissipation patterns 130b. The main heat dissipation patterns 130a lengthen a moving distance of heat to reduce the overall amount of heat dissipation, and the sub heat dissipation patterns 130b are positioned around the main heat dissipation patterns 130a.

The main heat dissipation patterns 130a are bent at least once to lengthen heat transfer paths in a limited area. Furthermore, one end of each of the main heat dissipation patterns 130a is disposed adjacent to the fuse 120. The other end faces the edges of the first upper and lower interconnections 110a and 140a and is spaced from the fuse 120. Accordingly, the high-temperature heat generated when the electrical fuse 120 is ruptured is transferred through as long a path as possible, and then discharged externally with a lowered temperature. One or more main heat dissipation patterns 130a may be provided. According to the embodiment, the first main group of heat dissipation paths 130_1 may comprise one pair of symmetrical main heat dissipation patterns 13. However, the structure of the main heat dissipation patterns 130a is not limited to this embodiment, and the main heat dissipation patterns 130a may be bent in various forms.

The plurality of sub heat dissipation patterns 130b may be arranged in a stripe shape, for example, around the main heat dissipation patterns 130a. The sub heat dissipation patterns 130b may relieve the heat dissipated by the main heat dissipation patterns 130a once more, and then discharge the heat externally. The sub heat dissipation patterns 130b are not limited to the stripe shape and may be formed in various other shapes. The sub heat dissipation patterns 130b may induce a temperature reduction caused by the collision of high-temperature heat or by stretching the heat transfer paths.

The second group of heat dissipation paths 130_2 also may comprise a plurality of heat dissipation patterns which are electrically connected to the second lower interconnection 110b and the second upper interconnection 140b. The plurality of heat dissipation patterns composing the second group of heat dissipation paths 130_2 may be divided into main heat dissipation patterns 130a and sub heat dissipation patterns 130b and 130c. The main heat dissipation patterns 130a increase a moving distance of heat generated from the fuse 120 to reduce the overall amount of heat dissipation, and the sub heat dissipation patterns 130b and 130c are positioned around the main heat dissipation patterns 130a.

The main heat dissipation patterns 130a of the second group of heat dissipation paths 130_2 may play the same role as the man heat dissipation patterns 130a formed in the first group of heat dissipation paths 130_1, and may be symmetric.

The sub heat dissipation patterns 130b and 130c of the second group of heat dissipation paths 130_2 are configured to discharge heat dissipated by the main heat dissipation patterns 130a externally, like the sub heat dissipation patterns 130b of the first group of heat dissipation paths 130_1. The sub heat dissipation patterns 130c in the concave portion of the second lower interconnection 110b are shorter than the sub heat dissipation patterns 130b due to the structure of the second lower interconnection 110b.

The lower interconnections 110a and 110b may be configured to have a higher resistance than the upper interconnections 140a and 140b because the currents are concentrated on the fuse 120. Due to this structure, it is possible to secure a low current density. In this embodiment, a larger number of heat dissipation patterns are positioned at the second lower interconnection 110b than at the first lower interconnection 110a. This configuration substantially increases the resistance of the first lower interconnection 110a, which is directly connected to the fuse 120.

When a predetermined amount of current is applied to the fuse 120 in the semiconductor apparatus configured in the above-described manner, high-temperature heat is generated in the center of the fuse 120 to rupture the fuse 120.

The high-temperature heat generated when the fuse 120 is ruptured collides with the plurality of heat dissipation patterns 130a to 130c disposed around the fuse 120, and the temperature thereof is primarily lowered. Then, while the heat flows along the paths of the heat dissipation patterns 130a to 130c, the temperature is secondarily lowered. Therefore, when the heat is discharged externally, the temperature becomes low enough such that it has no external effect. Accordingly, it is possible to reduce a thermal burden of adjacent cells caused by the fuse rupture.

Figure 5:
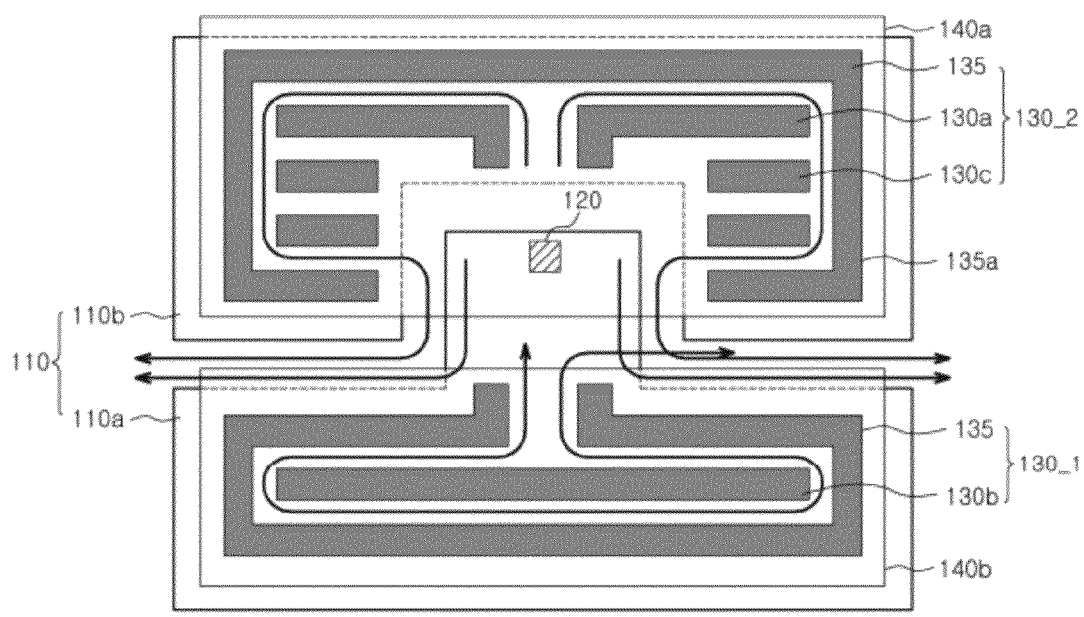
FIG. 5 is a plan view of an electrical fuse structure according to one embodiment of the invention.

Referring to FIG. 5, the first and second group of heat dissipation paths 130_1 and 130_2 may further comprise loop-shaped heat dissipation patterns 135. The loop-shaped heat dissipation patterns 135 are disposed at the edges of the first and second upper and lower interconnections 110a, 140a, 110b, and 140b. It also loops the residual heats which are relived by the main heat dissipation patterns 130a and/or the sub heat dissipation patterns 130b and 130c. The heat is then discharged with a lowered temperature.

At this time, some of the main heat dissipation patterns 130a and the sub heat dissipation patterns 130b and 130c in the first and second group of heat dissipation paths 130_1 and 130_2 may be removed depending on the sizes of the first and second upper and lower interconnections 110a, 140a, 110b, and 140b, and the line width of the loop-shaped heat dissipation patterns 135.

The addition of the loop-shaped heat dissipation pattern 135 may further lower the temperature of the heat generated by a ruptured fuse, possibly preventing property change of adjacent elements.

According to the embodiment of the present invention, various types of heat dissipation patterns are formed in a contact structure similar to the fuse. The temperature of the heat generated when the fuse is ruptured is accordingly lowered by the collision with the heat dissipation patterns and the paths thereof. When the heats are discharged externally, the temperature is too low to affect the outside. Therefore, the thermal burden of the adjacent cells is reduced.

Furthermore, the density of the heat dissipation patterns may be adjusted to improve a current density at the lower interconnection. Therefore, it is possible to improve the fuse rupture efficiency.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A semiconductor integrated circuit comprising:
    a pair of interconnections;
    a fuse connecting the pair of interconnections; and
    one or more heat dissipation patterns connecting the pair of interconnections and are disposed around the fuse.

2. The semiconductor integrated circuit according to claim 1, wherein the one or more heat dissipation patterns comprise:
    a main heat dissipation pattern whose one end is disposed adjacent to the fuse and the other end faces an edge of one of the interconnections.

3. The semiconductor integrated circuit according to claim 2, wherein the main heat dissipation pattern has a portion that is bent at least once.

4. The semiconductor integrated circuit according to claim 2, wherein the one or more heat dissipation patterns further comprise at least one sub heat dissipation pattern disposed around the main heat dissipation pattern.

5. The semiconductor integrated circuit according to claim 4, wherein the at least one sub heat dissipation pattern has a stripe shape.

6. The semiconductor integrated circuit according to claim 1, wherein at least one of the one or more heat dissipation patterns comprises loop-shaped heat dissipation pattern surrounding an edge of the pair of interconnections.

7. The semiconductor integrated circuit according to claim 1, wherein one of the pair of interconnections comprises a first interconnection unit having a protruding portion and a second interconnection unit spaced a predetermined distance from the first interconnection unit and having a concave portion that houses the protruding portion.

8. The semiconductor integrated circuit according to claim 6, wherein the fuse is in contact with the protruding portion of the first interconnection unit.

9. The semiconductor integrated circuit according to claim 1, wherein one of the pair of the interconnections is connected to a program voltage source, and the other is connected to a ground terminal.

10. A semiconductor integrated circuit comprising:
    a first lower interconnection having a predetermined area;
    a second lower interconnection positioned on substantially the same plane as the first lower interconnection and spaced a predetermined distance from the first lower interconnection;
    a first upper interconnection configured to overlap with the first lower interconnection;
    a second upper interconnection positioned on substantially the same plane as the first upper interconnection, spaced a predetermined distance from the first upper interconnection, and configured to overlap with the second lower interconnection;
    a fuse connected to the first lower interconnection and the second upper interconnection;
    a first group of heat dissipation paths connecting the first lower interconnection and the first upper interconnection and are disposed around the fuse; and
    a second group of heat dissipation paths connecting the second lower interconnection and the second upper interconnection and are disposed around the fuse.

11. The semiconductor integrated circuit according to claim 10, wherein the first group of heat dissipation paths comprise a plurality of heat dissipation patterns, and the number of the plurality of heat dissipation patterns is smaller than the number of heat dissipation patterns composing the second group of heat dissipation paths.

12. The semiconductor integrated circuit according to claim 10, wherein at least one of the first and second groups of heat dissipation paths comprises:
    a main heat dissipation pattern having one end which is disposed adjacent to the fuse and the other end which is disposed adjacent to the edge of the interconnections and has at least one bent portion; and
    at least one sub dissipation pattern disposed around the main heat dissipation pattern.

13. The semiconductor integrated circuit according to claim 12, wherein the sub heat dissipation pattern has a stripe structure.

14. The semiconductor integrated circuit according to claim 10, wherein the first lower interconnection has a protruding portion protruding toward the second lower interconnection, and the second lower interconnection has a concave portion housing the protruding portion.

15. The semiconductor integrated circuit according to claim 14, wherein the fuse is in contact with the protruding portion of the first lower interconnection.

16. The semiconductor integrated circuit according to claim 10, wherein the first group of heat dissipation paths further comprise a loop pattern surrounding the edges of the first upper and lower interconnections.

17. The semiconductor integrated circuit according to claim 10, wherein the second group of heat dissipation paths further comprise a loop pattern surrounding the edges of the second upper and lower interconnections.

* * * * *